United States Patent [19]

Meeks et al.

[11] Patent Number: 4,975,414
[45] Date of Patent: Dec. 4, 1990

[54] RAPID PRODUCTION OF BULK SHAPES WITH IMPROVED PHYSICAL AND SUPERCONDUCTING PROPERTIES

[75] Inventors: Henry S. Meeks, Roseville; Sundeep V. Rele, Sacramento, both of Calif.

[73] Assignee: Ceracon, Inc., Sacramento, Calif.

[21] Appl. No.: 435,249

[22] Filed: Nov. 13, 1989

[51] Int. Cl.⁵ .................. H01L 39/12; H01L 5/08; H01L 39/24
[52] U.S. Cl. .................. 505/1; 419/49; 419/20; 419/21; 419/22; 419/19; 505/739; 505/780; 505/781; 505/823
[58] Field of Search .................. 419/49, 19, 20, 22, 419/21; 505/1, 739, 780, 781, 823

[56] References Cited

U.S. PATENT DOCUMENTS

| | | | |
|---|---|---|---|
| 2,807,082 | 8/1952 | Zambrow et al. | 29/488 |
| 3,350,179 | 10/1967 | Stenerson | 29/182.5 |
| 3,356,496 | 12/1967 | Hailey | 75/226 |
| 3,677,947 | 7/1972 | Ray et al. | 256/62.54 |
| 3,700,435 | 3/1971 | Chandhok | 75/214 |
| 3,706,579 | 12/1972 | Michael | 106/1 |
| 3,826,807 | 9/1971 | Green | 264/39 |
| 3,933,536 | 1/1976 | Doser et al. | 148/105 |
| 3,992,200 | 11/1976 | Chandhok | 75/211 |
| 4,265,681 | 5/1981 | Krause et al. | 148/111 |
| 4,389,362 | 6/1983 | Larsson | 264/111 |
| 4,446,100 | 5/1984 | Alderborn et al. | 419/48 |
| 4,499,048 | 2/1985 | Hanejko | 419/49 |
| 4,501,718 | 2/1985 | Bradt | 419/49 |
| 4,518,441 | 5/1985 | Hailey | 148/11.5 P |
| 4,539,175 | 9/1985 | Lichti et al. | 419/49 |
| 4,541,877 | 9/1985 | Stadelmaier et al. | 148/101 |
| 4,568,516 | 2/1986 | Alderborn et al. | 419/26 |
| 4,597,938 | 7/1986 | Matsuura et al. | 419/23 |
| 4,601,875 | 7/1986 | Yamamoto et al. | 419/23 |
| 4,602,957 | 7/1986 | Pollock | 75/246 |
| 4,640,711 | 2/1987 | Lichti | 75/248 |
| 4,656,002 | 4/1987 | Lizenby et al. | 419/10 |
| 4,663,066 | 5/1987 | Fruchart et al. | 252/62.51 |
| 4,684,406 | 8/1987 | Matsurra et al. | 75/244 |
| 4,689,163 | 8/1987 | Yamashita et al. | 252/62.54 |
| 4,808,224 | 2/1989 | Anderson et al. | 75/246 |
| 4,853,178 | 8/1989 | Oslin | 419/23 |

OTHER PUBLICATIONS

Ormerrod, J., "Processing and Physical Metallurgy of NeFeB and Other R. E. Magnets", pp. 69-92.
Bushcow, K. H. J., "New Permanent Magnet Materials", *Mat Sci Rep* 1, 1-64, 1986, North Holland, Amsterdam.
Hadfield, D., "Perspective and Prospective Overview of Rare-Earth Transition Metall-Metalloid Permanent Magnets", pp. 420-425, 1987.
Paik, C. R., Miho, H., Okada, M., Homma, M., "Improvements of Coercive Force in Ce-Didymium-FE-B Powders Prepared by Conventional Powder Techniques", 1987, Digest of Intermag '87, Intern Magnestics Conf., Apr. 14-17, Tokyo, Japan.
EPO Publication 1,144,112.

*Primary Examiner*—Stephen J. Lechert, Jr.
*Attorney, Agent, or Firm*—William W. Haefliger

[57] ABSTRACT

The method of producing a superconducting product includes: providing a pressed-powder preform consisting essentially of $REBa_2Cu_3O_x$ where $6.0 < x < 7.0$; preheating the preform to elevated temperature for a time period between 0 and 10 minutes, within a medium consisting of a mixture of refractory ceramic particles, carbonaceous particles and ultra fine graphitic particles; providing a preheated grain bed and embedding the heated preform in that bed, the bed having the same composition as the medium; and consolidating the preform to at least about 95% of theoretical density by application of pressure to the grain bed, thereby to form the product.

27 Claims, 1 Drawing Sheet

- 10 - ASSEMBLE POWDER
- 11 - FORM GREEN COMPACT
- 12 - HEAT COMPACT
- 13 - ISO-THERMAL TRANSFER TO PRESS, AND EMBED IN PREHEATED GRAIN
- 14 - CONSOLIDATE COMPACT
- 15 - ISO-THERMAL TRANSFER TO ANNEALING FURNACE
- 16 - OXYGEN ANNEAL

RAPID PRODUCTION OF BULK SHAPES WITH IMPROVED PHYSICAL AND SUPERCONDUCTING PROPERTIES

BACKGROUND OF THE INVENTION

This invention relates generally to production of superconductors, i e., products having extremely low resistance to flow of electrical current, and processes for the production of such products. Following the initial discovery of high transition temperatures ($T_c$) in the $K_2NiF_4$-type compound $La_{2-x}Ba_xCuO_4$, research activity upon superconducting oxides has been focused on the compound $YBa_2Cu_3O_{7-x}$ and its isostructural rare earth analogue. After the initial attainment of superconductivity at 95K, there have been reports published in the scientific literature of evidence for $T_c$'s as high as 240K. Among all of these materials there are some common structural features; namely, the presence of CuO layers and a significant degree of antisotrophy due to an elongated c-axis in the orthorhombic unit cell. Early band structure work on compounds with the $K_2NiF_4$-type structure emphasized this reduced dimensiorality and the impact of these crystallographic features on the superconducting properties.

Practical application of these remarkable materials requires control of both the metallurgical and ceramic processing techniques to attain optimal critical parameters, such as the critical current density ($J_c$) and upper critical magnetic field ($H_{c2}$), while preserving the high superconducting critical temperature ($T_c < 90K$). Technologically, it is important to maximize these parameters at the boiling point of liquid nitrogen (77K) or above in order to utilize this convenient, inexpensive cryogenic liquid.

It is recognized that optimal $T_c$ values and homogeneity of the superconducting phase, as evidenced by narrow transition widths, are exceptionally sensitive to the oxygen concentration in the orthorhombic phase of $YBa_2Cu_3O_{7-x}$ and its rare earth analogues. The best, consistent results occur for X in the range 0.1 to 0.2. This fact is of importance to all processing of bulk material.

While the potential technological impact of these materials is enormous, their immediate application is severely limited by certain inherent drawbacks. In their present state, the ceramic super-conductors are brittle and unable to support any significant stress In addition, they are environmentally unstable, as they easily react with atmospheric moisture/$CO_2$ and are decomposed by exposure to high temperatures. Furthermore, critical current densities achievable in present bulk materials are on the order of $10^3$ amp/cm$^2$ at zero field, whereas many of the applications envisaged require values over $10^5$ amp/cm2, at quite high magnetic fields ($>10T$).

The bulk of the ongoing research on high $T_c$ superconductors is focused on the "123" compounds more specifically $YBa_2Cu_3O_{7-x}$, where $0.0 < X < 0.5$. The superconducting form of this material ($T_c \times 94K$) has an orthorhombic structure based on a stacking of three perovskite-like unit cells, $(BaCuO_{2.5}):(YCuO_{2.5})$ with rows of oxygen vacancies on the {001} type planes. The critical temperature appears to be very sensitive to the oxygen content, which in turn reflects the ionization state of the three Cu ions. When $X \times 0.5$, all the copper is present as $Cu^{2+}$, where at $x=0.0$ there is one $Cu^{3+}$ per unit cell (i.e. per molecule of $YBa_2Cu_3O_{7-x}$). Superconductivity requires an oxygen content of about $O_{6.9}$.

It is clear that oxygen control during processing is critical to successful superconductor fabrication. In the conventional processing approach, the $YBa_2Cu_3O_{7-x}$ shapes are produced by mixing and pressing the individual oxides, in powder form, and which are then reacted/sintered, typically at 900–950° C. in air for 12–16 hours.

The orthorhombic phase loses oxygen and transforms to a non-superconducting tetragonal structure at high temperatures, and accordingly, the sintered product is slowly cooled to allow oxygen pickup and reversion to the superconducting form.

Product densities from 50%–90% of the theoretical value (6.4 Mg/m$^3$) have been achieved by such conventional processing, the higher values ascribed to liquid phase sintering as $YBa_2Cu_3O_{7-x}$ CuO above 950° C. The porosity left in these compacts not only diminishes their structural integrity and increases the surface area exposed to environmental attach but is believed to play an important role in reducing critical current densities. More importantly, the oxygen content varies during the process and within the final product, making it difficult to achieve homogeneity in composition/microstructure/properties. There is, therefore, need for a process which achieves significant improvements, as are characterized by the herein disclosed process, and including rapid densification of a powder preform close to 100% of theoretical, while retaining superconductivity, as will be described, and while minimizing micro-structural degradation.

Also, there is need for processing the preform and product in such a way as to achieve relatively large weights and sizes.

SUMMARY OF THE INVENTION

It is a major object of the invention to provide a solution to the above problem and difficulties, and to achieve rapid and successful fabrication of superconductive products, employing rare earth (RE) of the composition $REBa_2Cu_3O_x$ (where $6.0 < X < 7.0$), or rare earth analogues, in powder form such power prior to processing being superconductive.

Basic steps of the method include:

(a) providing a pressed-powder preform selected from the group consisting essentially of $REBa_2Cu_3O_x$, where $6.0 < X < 7.0$, and rare earth analogs thereof, (b) preheating the preform to elevated temperature for a time period between 0 and 10 minutes, within a medium consisting of a mixture of refractory ceramic particles, carbonaceous particles and ultra fine graphitic particles, (c) providing a preheated grain bed and embedding the heated preform in the bed, the bed having the same composition as the medium, (d) and consolidating the perform to at least about 95% of theoretical density by application of pressure to the grain bed, thereby to form the product Grain size of the consolidated product is typically 5–10 microns. As will appear, the product so produced has a superconductivity temperature $T_c$ in excess of at least about 92K.

Further features of the process include elevated temperature preheating of the preform and of the grain bed, to between 850° C. and 1,100° C.; progressively increasing pressure application to the grain bed from about 0 to between 10 and 200 Ksi, and while maintaining the preform at such elevated temperature or temperatures;

and limiting the temperature of the preform during its consolidation to such level or levels to minimize O₂ loss and to avoid transformation of the molecular structure of the powder to the non-superconducting 2-1-1 or Y₂BaCuO₅ phase. Such pressure application is controlled to complete the ronsolidation in less than about 10 minutes.

It is a further object of the invention to control such preheating of the preform and pressure application to the preform, during consolidation, to minimize loss of O₂ below levels required for superconductivity. In this regard, O₂ loss below such levels is typically remedied by applying O₂ to the product, at elevated temperature, to effect O₂ absorption and enhanced superconductivity. This is, for example, carried out in an O₂ atmosphere and at different temperature levels and times will be seen. Product sizes of up to 50 millimeters by 20 millimeters, and up to 70 grams weight are achievable.

Further, the grain bed typically consists of a mixture of the following:
 (a) ceramic particles (80.0 to 99.8 weight percent);
 (b) carbonaceous particles (0.1 to 10.0 weight percent);
 (c) ultra fine graphite (0.1 to 10.0 weight percent).

These and other objects and advantages of the invention, as well as the details of an illustrative embodiment, will be more fully understood from the following specification and drawings, in which:

DRAWING DESCRIPTION

DETAILED DESCRIPTION

Figure 1:
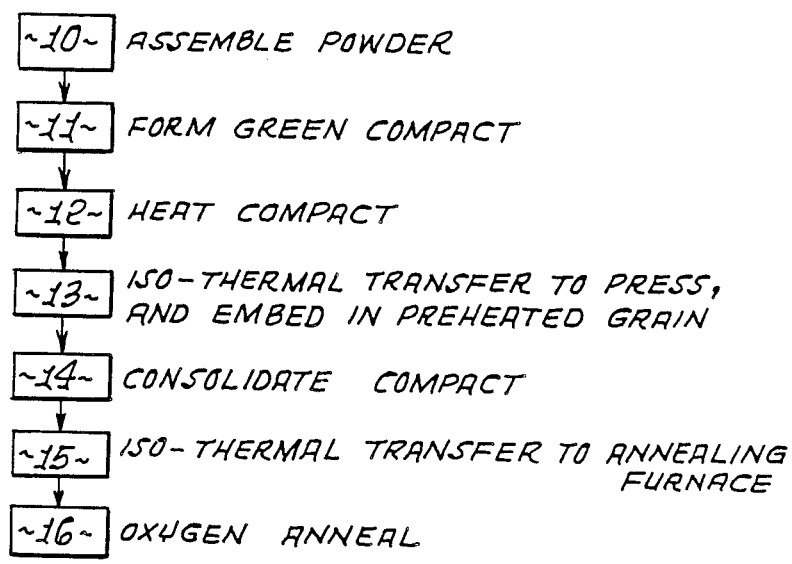
FIG. 1 is a flow diagram illustrating steps of the process.

Referring to FIG. 1, it shows at 11 the initial cold or hot pressed formation of a "green" compact or preform, consisting of superconductive ceramic powder The powder is initially assembled and placed in a forming mold at 10.

Figure 2:
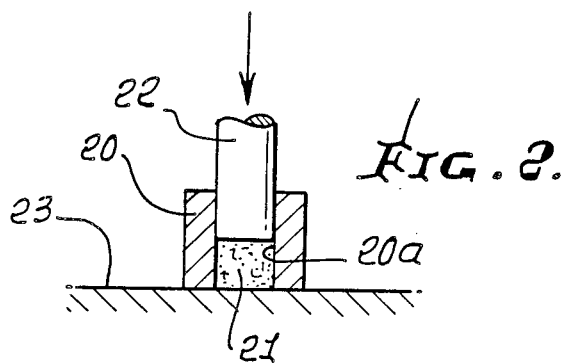
FIGS. 2 and 3 are elevations, in section, showing use of equipment for compacting preforms.
Figure 3:
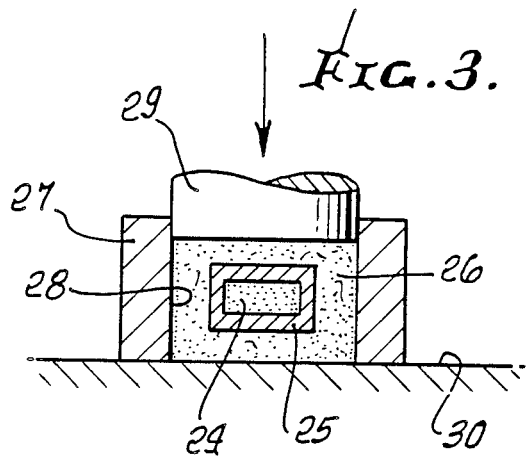

Pressures employed at step 11 are typically between 10 and 200 Ksi. FIG. 2 shows a die 20 having a bore 20a containing the mass 21 of particles which are being pressurized by a plunger 22, above a base 23, to form the compact An alternative method is shown in FIG. 3, wherein the preform particles 24 are located within a flexible container 25 (elastomer, for example), embedded in a mass or bed 26 of grain particles. The latter are contained within a die 27 having a bore 28 receiving a plunger 29 for pressurizing the grain, above a fixed or a floatable base 30. The flowable grain transmits pressure directly to the mass of particles 24, or via a container or jacket 25, to form the compact or preform. The flowable grain includes spherical carbonaceous particles (See also U.S Pat. Nos. 4,539,175, 4,499,049 and 4,501,718). The texts of those patents are incorporated here by reference Another method of cold pressing the superconductive powders into a shape is by filling an elastomer container, and subjecting the container to pressurization via a fluid medium inside a pressure vessel.

The preform materials of choice are selected from the group consisting essentially of REBa₂Cu₃O$_x$; where $6.0 < X < 7.0$ and RE is a rare earth element. Usable rare earth (RE) includes Yttrium, lanthanum, cerium, ytterbium, neodymium, and others found in the lanthanide series of the periodic table.

The power preform may also contain a noble metal powder of size range approximating the preform powder size range. That noble metal is selected from the group consisting of gold, silver and platinum, and oxides thereof, and is present in the preform in admixture therewith, in amount between 2 and 50 weight percent of the total preform weight Such noble metal power is non-reactive at selected temperatures, and enhances superconducting properties.

The preform is heated in a furnace (see step 12, FIG. 1) to a temperature range of 850° C. (1123K) to 1200° C. (1473K) for a period of 0 to 10 minutes. The preform is contained for preheating in a non-reactive ceramic/composite./refractory medium consisting of a free flowing refractory ceramic, free flowing carbonaceous particles and ultra fine graphitic particles. Such media tends to reduce O₂ loss from the preform during heating and provides for conditions of iso-thermal transfer. The furnace atmosphere may consist of O₂ or air. The composition of the PTM may be by volume percent as follows:

30 to 300 mesh refractory ceramic 80.0–99.8% by vol
30 to 300 mesh carbonaceous particle 0.1%–10% by vol
less than 325 mesh ultra fine graphite 1%–10% by vol Prior to consolidation, the preform is isothermically transferred from the preheating furnace to a consolidation zone in an associated consolidating die. See step 13 in FIG. 1.

The press includes a die 33 having a bore 34 containing the preheated grain bed 31, above a base 35. A plunger 36 fits the bore and pressurizes the flowable grain, the latter transferring pressure to the preform at all sides thereon The preform is reduced in size during consolidation. The consolidation step is indicated at 14 in FIG. 1.

Pressure to consolidate the superconductor oxide is applied through a downward moving ram to the heated grain bed which in turn converts the axially applied pressure to that of pseudo-isostatic pressure Pressures in the range of 10 Ksi (70 MPa) to 200 Ksi (1378 MPa) may be used and are applied at strain rates less than 20 inches per minute (10 mm/sec).

Dwell time at maximum pressure may be between 0 and 300 seconds.

Decompressive strain rates of 20 inches per minute (10 mm/sec) to 21 inches per minute (0.1 mm/sec) are used.

For consolidation purposes, the preheated preform is manually or robotically located within the grain bed 31 in the consolidation zone the grain having been preheated to a temperature between 850° C.& and 1200° C. The bed typically has the same composition as the preheat media referred to above; that is, both media and grain bed consist of refractory ceramic particles, carbonaceous particles, and ultra fine graphite In this regard, the media and bed both have a composition as follows for optimum results:

30 to 300 mesh refractory ceramic 88.0–99.8% by vol
30 to 300 mesh carbonaceous particle 0.1%–10% by vol
less than 325 mesh ultra fine graphite 0.1%–10% by vol Further, if desired, the bed may consist of media, i.e, the media itself is transferred to the consolidation die zone.

Post consolidation transfer is simplified by the improved pressure transmitting grain composition which prevents grain fusing.

Subsequently, the consolidated preform may be easily removed by dumping or extracting it from the grain bed.

The consolidated preform is thereby transferred under near isothermal conditions to a waiting bed of appropriate temperature.

The consolidated preform is now allowed to slowly cool down to room temperature, thereby preventing thermally induced cracking.

Step 15, seen in FIG. 1, combines iso-thermal transfer of the consolidated preform to an annealing furnace.

Step 16, following consolidation, comprises applying $O_2$ to the compacted product, at elevated L temperatures, in the annealing furnace, to effect $O_2$ absorption, and thereby enhance superconductivity. For example, whereas the preform loses $O_2$ during heating and/or consolidation, which may destroy superconductivity, the $O_2$ loss is compensated by diffusing $O_2$ into the consolidated product for a time interval, and at $O_2$ atmosphere pressure levels and temperatures to restore superconductivity. This is referred to as "oxygen annealing".

Accordingly, once the consolidated preform has cooled to room temperature, it is subjected to a precisely controlled restorative thermo-chemical heat treatment. This process provides for the replacement of any oxygen that may have been lost during processing. Complete recovery of any loss in superconductive properties arising from distortions in the lattice parameters or oxygen depletion is achieved by heating the bulk consolidated shape in oxygen to restore oxygen in the processed bulk superconductor shapes, as oxygen recovery in these large shapes (>50 grams in weight) is sluggish The step includes slow heating to 930° C. (1203K) and holding for 12-48 hours, slow cooling at rates $\leq 10°$ C./min (10K/min., through the tetragonal to orthombic phase transformation region to a temperature in the range of 350° C. (623K) to 550° C. (823K) where it is held for approximately 1 to 96 hours, and then slow cooling at a rate of $\leq 10°$ C./min (10K/min) to room temperature The entire process is carried out in an oxygen atmosphere.

EXAMPLE I $YBa_2Cu_3O_{6.9}$ powder was cold iso-statically pressed in an elastomer mold at 45 Ksi (310 $MP_a$) and at room temperature. The shape of the pressed preform was a right cylinder about 13 mm in height and 10 mm in diameter.

Figure 4:
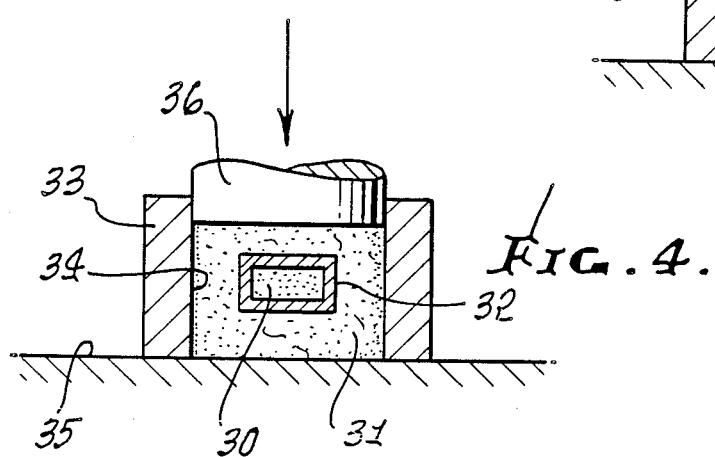
FIG. 4 is an elevation, in section, showing use of equipment for consolidating a preform.

The preform was then heated for 6 to 10 minutes in a tubular furnace in air, and in media as referred to above The heating temperature was 900° C. The heated preform was quickly transferred in air to a grain filled die and completely embedded in the bed of heated particles, as by a robot. The grain temperature was the same as the preform preheat and media temperature. The embedded preform was compressed under high uniaxial pressure applied to the grain by the action of a ram in the die, with pressure application as in FIG. 4. Pressure was steadily increased to 25 Tsi in about 10 seconds and held for 30 seconds after which the pressure was relieved and the consolidated part retrieved from the bed. The part was about 8 mm thick. The complete reference to the process is to be found elsewhere [5.,6.]. In the above, the media and grain had the same composition as follows:
150 mesh refractory ceramic 94 vol. %
150 mesh carbonaceous particles 2 vol. %
−325 mesh ultra fine graphite 4 vol. %

EXAMPLE II

Same as Example I except that the media and grain had the following compositions:
100 mesh refractory ceramic 94% by vol.
40 mesh carboneous particle 2% by vol.
less than 325 mesh ultra fine graphite 4% by vol.

EXAMPLE III 70 mesh refractory ceramic 94% by vol.
40 mesh carboneous particle 2% by vol.
less than 325 mesh ultra fine graphite 4% by vol.

EXAMPLE IV

Same as Examples I and II except that after consolidation, the product was slowly heated to 930° C. and held for 24 hours; it was then slowly cooled to 450° C. to a rate of 1° C./min', where it was held for 24 hours, and then slowly cooled at a rate of 1° C./min' to room temperature. All of this slow heating and slow cooling was carried out in an $O_2$ atmosphere.

A comparison of product properties, produced by the present process as compared with current art, is as follows:

| PROPERTY | PRESENT PROCESS | CURRENT ART |
| --- | --- | --- |
| Density | 97% | 95% |
| Size | 50 mm × 10 mm | 12 mm × 2 mm |
| Weight | 70 grams | 2-3 grams |
| Temperature | 950° C./30 sec/25 Tsi | 975° C./60 min/.14 Tsi |
| Reaction Zone | None | 4 Regions; One SC |
| Grain Size | 5–10μ | 50–70μ |
| $J_c$ | 250 amps/cm$^2$ | ? |
| $T_c$ | 92K–93K | 90K |
| Reprod. Shape Control | Yes | No |
| Useful Superconductor Volume (%) | 99 | 25 |

REFERENCES

1. J. Ormerod, "Processing and Physical Metallurgy of NeFe B and other R. E. Magnets", in "NdFe Permanent Magnets Their Present and Future Applications", Elsevier Appl Sci Pub London and New York, p. 69–92.

2. K. H. J. Bushcow, "New Permanent Magnet Materials", Mat Sci Rep 1, 1–64, 1986 North-Holland, Amsterdam.

3. D. Hadfield, "Perspective and Prospective Overview of Rate-Earth Transition Metal—Metalloid Permanent Magnets", Met Powder Rep., 42, 420–425 (1987).

4. C. R. Paik, H Miho, M. Okada, Homma, "Improvements of Coercive Force in Ce-Didymium-Fe-B Powders Prepared by Conventional Powder Techniques", 1987 Digest of Intermag '87, Intern Magnetics Conf, April 14–17, Tokyo, Japan GG03.

5. W. P. Lichti, A. F. Hofstatter, "Method of Object Consolidation Employing Graphite Particulate", U.S. Pat. No. 4,640,711, Feb. 3, 1987.

6. F. G. Hanejko, "Method of Consolidating a Metallic or Ceramic Body", U.S. Pat. No. 4,499,049, Feb. 12, 1985.

We claim:

1. In the method of producing a superconducting product, the steps that include:
   (a) providing a pressed-powder preform selected from the group consisting essentially of $REBa_2Cu_3O_x$, where $6.0 < X < 7.0$, and RE is a rare earth element,
   (b) preheating the preform to elevated temperature for a time period between 0 and 10 minutes, within a medium consisting of a mixture of refractory ceramic particles, carbonaceous particles and ultra fine graphitic particles,
   (c) providing a preheated grain bed and embedding the heated preform in said bed, the bed having the same composition as said medium,
   (d) consolidating the preform to at least about 95% of theoretical density by application of pressure to the grain bed, thereby to form said product,
   (e) and applying $O_2$ to the consolidated product, at elevated temperature, to effect $O_2$ absorption and enhanced superconductivity.

2. The method of claim 1 wherein said product has a superconducting temperature Tc of at least about 92K.

3. The method of claim 1 wherein said elevated temperature is between 850° C. and 1,100° C.

4. The method of claim 1 wherein said pressure application to the grain bed is between and 200 Ksi.

5. The method of claim 4 wherein the pressure application is at strain rates less than 20 inches per minute.

6. The method of claim 5 wherein dwell time at maximum pressure is between 0 and 300 seconds.

7. The method of claim 6 wherein pressure application is thereafter reduced at strain rates between 20 and 0.2 inches per minute.

8. The method of claim 3 including preheating the grain bed to a temperature at least about as high as that of said preheated preform.

9. The method of claim 8 wherein the preheated preform is transferred isothermally into said preheated grain bed.

10. The method of claim 1 wherein said medium and said bed each consist of
   30 to 300 mesh refractory ceramic 88.0–99.8% by vol
   30 to 300 mesh carbonaceous particle 0.1%–10% by vol
   less than 325 mesh ultra fine graphite 0.1%–10% by vol.

11. The method of claim 1 including removing the preform from the grain bed after said consolidation thereof, and allowing the preform to cool to room temperature.

12. The method of claim 1 wherein $O_2$ is lost from the preform during its processing and including the step of replacing $O_2$ into the consolidated preform by heating thereof in an $O_2$ atmosphere.

13. The method of claim 8 wherein said heating in said $O_2$ atmosphere includes slow heating to about 930° C., holding at that temperature for 12 to 48 hours, slow cooling to a temperature between 350° C. and 550° C., holding at that temperature for 1 to 96 hours, and then slow cooling to room temperature.

14. The method of claim 1 wherein the consolidated preform has weight of at least 50 grams.

15. In the method of producing a superconducting product, the steps that include:
   (a) providing a pressed-powder preform consisting of superconducting ceramic powder, said powder consisting of a rear earth, barium, copper, oxide complex,
   (b) preheating the preform to elevated temperature,
   (c) providing a grain bed and embedding the heated preform in said bed,
   (d) consolidating the preform to at least about 95% of theoretical density by application of pressure to the grain bed, thereby to form said product,
   (e) and restoring to the product $O_2$ that is lost during said steps (b), (c) and (d), by slow heating in an $O_2$ atmosphere to elevated temperature, followed by slow cooling in said atmosphere to room temperature.

16. The method of claim 15 wherein said product has a superconducting temperature Tc of about 92K.

17. The method of claim 15 wherein said elevated temperature is between 850° C. and 1100° C.

18. The method of claim 15 wherein said pressure application to the grain bed is progressively increased to between 10 Ksi and 200 Ksi, and while maintaining the preform at said elevated temperature.

19. The method of claim 15 including preheating the grain bed to a temperature at least about as high as that of said preheated preform.

20. The method of claim 15 wherein the grain bed has the following composition:
   30 to 300 mesh refractory ceramic 80.0–99.8% by vol
   30 to 300 mesh carbonaceous particle 0.1%–10% by vol
   less than 325 mesh ultra fine graphite 0.1%–10% by vol.

21. The method of claim 15 including providing an containment medium for the preform during said heating thereof, said containment medium having the following composition:
   30 to 300 mesh refractory ceramic 80.0–99.8% by vol
   30 to 300 mesh carbonaceous particle 0.1%–10% by vol
   less than 325 mesh ultra fine graphite 0.1%–10% by vol.

22. The method of claim 1 wherein RE is a rare earth selected from the group consisting essentially of Yttrium, lanthanum, cerium, ytterbium, and neodymium.

23. The method of claim 1 wherein RE is Yttrium.

24. The method of claim 1 wherein the powder preform may also contain a noble metal powder.

25. The method of claim 24 wherein the noble metal is selected from the group consisting of gold, silver, platinum, and oxides thereof.

26. The method of claim 1 wherein said step a) is carried out by filling powder into a deformable elastomeric container and exerting compressive force on the container.

27. The method of claim 25 wherein the noble metal powder is present in amount between 2 and 50 weight percent of the preform weight.

* * * * *

UNITED STATES PATENT AND TRADEMARK OFFICE
CERTIFICATE OF CORRECTION

PATENT NO. : 4,975,414

DATED : Dec. 4, 1990

INVENTOR(S) : Henry S. Meeks and Sundeep V. Rele

It is certified that error appears in the above-identified patent and that said Letters Patent is hereby corrected as shown below:

Column 7, line 26; "cation to the grain bed is between 200 Ksi." should read --"cation to the grain bed is between 10 Ksi and 200 Ksi.--

Signed and Sealed this

Twelfth Day of May, 1992

*Attest:*

DOUGLAS B. COMER

*Attesting Officer*     *Acting Commissioner of Patents and Trademarks*